United States Patent
Lin et al.

(10) Patent No.: US 9,658,526 B2
(45) Date of Patent: May 23, 2017

(54) MASK PELLICLE INDICATOR FOR HAZE PREVENTION

(71) Applicant: Taiwan Semiconductor Manufacturing Company, Ltd., Hsin-Chu (TW)

(72) Inventors: Kuan-Wen Lin, Taichung (TW); Sheng-Chi Chin, Hsinchu (TW); Ting-Hao Hsu, Hsinchu (TW); Tzu-Ting Chou, Hsin-Chu (TW); Shu-Hsien Wu, Hsin-Chu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 121 days.

(21) Appl. No.: 14/754,902

(22) Filed: Jun. 30, 2015

(65) Prior Publication Data
US 2017/0003585 A1    Jan. 5, 2017

(51) Int. Cl.
*G03F 1/62* (2012.01)
*G03F 1/64* (2012.01)
*G03B 27/62* (2006.01)

(52) U.S. Cl.
CPC ............... *G03F 1/64* (2013.01); *G03F 1/62* (2013.01); *G03B 27/62* (2013.01); *G03B 27/625* (2013.01); *G03B 27/6242* (2013.01)

(58) Field of Classification Search
CPC .. G03F 1/62; G03F 1/64; G03B 27/62; G03B 27/6242; G03B 27/625
USPC .............................. 430/5; 355/75, 76; 428/14
See application file for complete search history.

(56) References Cited

U.S. PATENT DOCUMENTS

| | | |
|---|---|---|
| 6,841,317 B2 | 1/2005 | Wang |
| 8,724,088 B2 | 5/2014 | Lin et al. |
| 2011/0244395 A1 | 10/2011 | Huang et al. |

FOREIGN PATENT DOCUMENTS

| | | |
|---|---|---|
| CN | 203324647 | 4/2013 |
| KR | 10-2008-0062746 | 7/2008 |
| TW | 200832050 A | 8/2008 |
| TW | 201510638 A | 3/2015 |
| TW | 201516557 A | 5/2015 |
| WO | WO2010-041508 A1 | 4/2010 |

OTHER PUBLICATIONS

Masaru Kobayashi et al., "Photocatalytic Activity of Titanium Dioxide and Zinc Oxide," Cosmetics & Toiletries Magazine, vol. 112, Jun. 1997, Allured Publishing Corp., U.S. Cosmetics Corp., Dayville, CT, USA, pp. 83-85.

U.S. Appl. No. 14/163,287, filed Jan. 24, 2014, by Ching-Wei Shen, Kuan-Wen Lin, Chi-Lun Lu, Ting-Hao Hsu, Sheng-Chi Chin, and Anthony Yen, for Lithography System and Method for Haze Elimination, 14 pages of text, 5 pages of drawings.

*Primary Examiner* — Christopher Young
(74) *Attorney, Agent, or Firm* — Haynes and Boone, LLP

(57) ABSTRACT

A pellicle mask assembly includes a mask, a pellicle frame, and a pellicle membrane. The pellicle frame has a bottom side attached to the mask, and a top side covered by the pellicle membrane. The pellicle frame includes a coating on its inner surface and the coating is configured to monitor a change of environment inside the pellicle mask assembly. In embodiments, the change of environment includes increased humidity and/or increased chemical ion density inside the pellicle mask assembly. Methods of making and using the pellicle mask assembly are also disclosed.

20 Claims, 4 Drawing Sheets

MASK PELLICLE INDICATOR FOR HAZE PREVENTION

BACKGROUND

In semiconductor technologies, masks (photomasks or reticles) are formed with predesigned integrated circuit (IC) patterns. The masks are used to transfer those predesigned IC patterns to semiconductor wafers in lithography processes. Any defect on the masks will be transferred to semiconductor wafers and cause yield issues and quality concerns. In addition, particulate contamination is a source of mask defects.

One type of particulate contamination is mask haze, which may be introduced during mask making, handling, or lithography processes. For example, chemicals, such as $SO_2$ and/or $NH_3$, may be outgassed during mask making process. Despite some cleaning procedures, these chemicals continue to exist at the surface of the masks during lithography exposure process, such as deep ultraviolet (DUV) exposure process. The DUV exposure process generates highly energized photons that facilitate reaction of these chemicals with atmospheric gases to produce ammonium sulfate nanocrystals, causing mask haze.

Mask haze may cause printing errors on a wafer. Therefore, it is desirable to prevent mask haze to be formed onto the masks.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
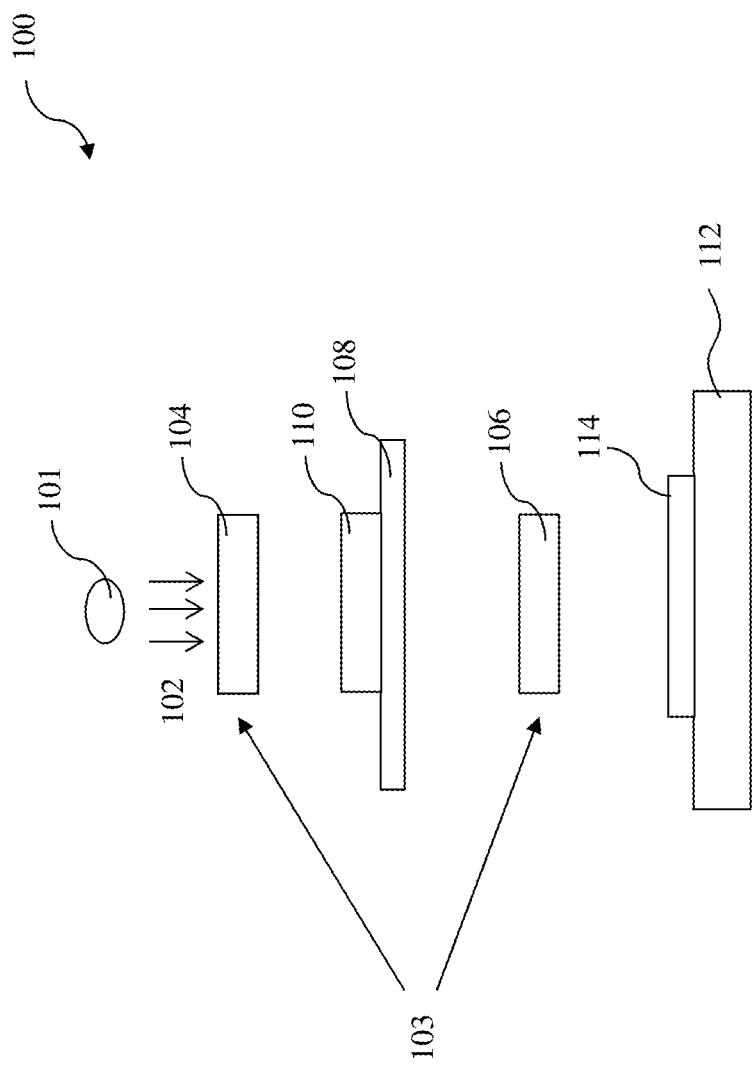
FIG. 1 is a schematic view of a lithography apparatus constructed according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As discussed above, it is desirable to eliminate particulate contamination, such as mask haze, on a mask surface. One method of reducing particulate contamination is to use an optical pellicle (or pellicle) to seal a mask. A pellicle includes a transparent pellicle membrane mounted on a pellicle frame that is attached to the mask surface. Contaminating particles fall onto the pellicle membrane instead of the surface of the mask. Due to different depth of focus (DOF), particles on the surface of the pellicle lie outside the focal plane of the illuminating light and therefore do not interfere with the projected mask pattern. However, even with a pellicle, some environmental gases may still enter into the pellicle, such as through some vent holes in the pellicle frame, or may be trapped inside the pellicle. Therefore, haze formation is not completely prevented even with a pellicle.

The present disclosure is generally related to monitoring the environment inside a pelliclized mask (or pellicle mask assembly or mask assembly) during and/or after lithography exposure processes. An object of the present disclosure is to give one or more visual indications that mask haze is going to form on the mask surface. Following such indication(s), the mask may be removed from the pellicle mask assembly and sent for cleaning. This prevents the mask surface from being contaminated by a large amount of mask haze, which would cause increased yield loss and would become difficult to remove from the mask surface. Therefore, the present disclosure provides the benefits of saving overall operational costs.

FIG. 1 illustrates a schematic view of a lithography system (or an exposure apparatus) 100 that may benefit from various aspects of the present disclosure. With reference to FIG. 1, the lithography system 100 and the method to utilize the same are collectively described. The lithography system 100 includes an exposure source (or radiation source) 101, an optical subsystem 103, a mask stage 108 configured and designed to secure a mask assembly 110, and a wafer stage 112 that is designed to secure a wafer 114. The lithography system 100 is designed to perform a lithography exposure process in a suitable mode, such as a step-and-scan mode.

The exposure source 101 provides radiation energy 102. The exposure source 101 may be any suitable light source, such as ultraviolet (UV) light. In various examples, the exposure source 101 may include a light source such as UV source, deep UV (DUV) source, extreme UV (EUV) source, and X-ray source. For example, the exposure source 101 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source is an EUV source having a wavelength of about 13.5 nm or less.

The optical subsystem 103 receives the radiation energy 102 from the exposure source 101, modulates the radiation energy 102 by the image of the mask assembly 110, and directs the radiation energy 102 to a resist layer coated on the wafer 114. The optical subsystem 103 may be designed to have either a refractive or a reflective mechanism, depending on the type of the radiation energy 102. For example, when the radiation energy 102 is a DUV ray, a refractive mechanism using lenses is appropriate, whereas when the radiation energy 102 is an EUV ray, a reflective mechanism using mirrors is appropriate.

In the present example, the optical subsystem 103 includes an illumination unit (e.g., a condenser) 104. The illumination unit 104 may include a single lens or a lens module having multiple lenses and/or other lens components. For example, the illumination unit 104 may include micro-lens arrays, shadow masks, and/or other structures designed to aid in directing radiation energy 102 from the exposure source 101 onto the mask assembly 110.

In the present example, the optical subsystem 103 includes a projection unit 106. The projection unit 106 may have a single lens element or a plurality of lens elements configured to provide proper illumination to the resist layer on the wafer 114. The optical subsystem 103 may further include additional components such as an entrance pupil and an exit pupil to form an image of the mask assembly 110 on the wafer 114. In another embodiment, the optical subsystem 103 may alternatively include various mirror components to provide a reflective mechanism of imaging.

In an embodiment, the mask stage 108 is configured and designed to secure the mask assembly 110 by a clamping mechanism, such as vacuum chuck or e-chuck. The mask stage 108 is further designed to be operable to move for various actions, such as scanning. During a lithography exposing process (or exposure process), the mask assembly 110 is secured on the mask stage 108 and positioned such that an integrated circuit pattern defined thereon is imaged on the resist layer coated on the wafer 114. In an embodiment, the mask assembly 110 includes a transparent substrate and an absorption layer that is patterned to have one or more openings through which the radiation energy 102 may travel without being absorbed by the absorption layer.

In another embodiment where the radiation energy 102 is EUV energy, the mask assembly 110 includes a substrate coated with a plurality of films to provide a reflective mechanism. For example, the mask assembly 110 includes tens of alternating layers of silicon and molybdenum deposited on a substrate to act as a Bragg reflector that maximizes the reflection of EUV light. The mask assembly 110 further includes an absorption layer, such as a tantalum boron nitride film, patterned to define a layout pattern of an integrated circuit.

The wafer stage 112 is designed to secure the wafer 114. The wafer stage 112 is further designed to provide various motions, such as transitional motion and rotational motion. In an embodiment, the wafer 114 includes a semiconductor substrate having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. The wafer 114 is coated with the resist layer that is resistive to etch and/or ion implantation and is sensitive to the radiation energy 102.

The wafer 114 includes a plurality of fields having integrated circuits defined therein for one or more dies. During a lithography exposing process, the wafer 114 is exposed one field at a time. For example, the lithography system 100 scans the IC pattern defined in the mask assembly 110 and transfers it to one field, then steps to next field and repeats the scanning until the fields in the wafer 114 are exhausted. Each field includes one or more circuit dies and a frame region at a boundary area. After the lithography exposure process is applied to the resist layer coated on the wafer 114, the resist layer is further developed by a developing chemical to form a patterned resist layer that have various openings for subsequent semiconductor processing, such as etching or ion implantation.

In an embodiment, the lithography system 100 is designed for immersion lithography. An immersion liquid, such as water, is filled in the space between the projection unit 106 and the wafer stage 112 such that the optical refractive index is increased and the optical resolution of the lithography exposure process is enhanced. In this embodiment, the lithography system 100 may include various components designed and configured to provide, hold, and drain the immersion liquid.

During the lithography exposure processes, haze may form on surfaces of the mask assembly 110, which in turn causes printing errors on the wafer 114. Although the exact mechanism of the mask haze formation is still under study, the inventors of the present disclosure have discovered that moisture may be one of the root causes for the mask haze. For example, chemical residues from mask making and/or cleaning processes, such as $C_m$—$O_n$—$H_o$, ammonia ($NH_3$), amines, $SO_4^{2-}$, $MoSi_2$, and/or $MoO_x$, react with atmospheric gases, such as $H_2O$, $C_x$—$H_y$, and $SO_x$, thereby forming haze. Some chemical reactions are hypothesized as follows:

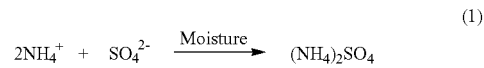

(1)

(2)

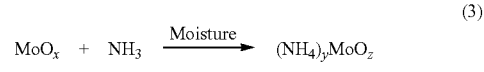

(3)

Such chemical reactions become more serious with the aid of highly energized photons produced with shorter exposure wavelengths of the radiation energy 102. Mask haze, in the forms of nano-scale crystals, may accumulate on the surfaces of the mask assembly 110 during each exposure process. When the mask haze grows to a certain size, it starts to cause printing errors on the wafer 114 and introduces defects to the IC products, such as circuit shorts, opens, etc.

One way to ameliorate the mask haze formation issue is to include a pellicle in the mask assembly 110. For example, the pellicle includes a pellicle membrane mounted on a pellicle frame which is adhesively attached to a mask having a substrate and a patterned absorption layer. The patterned absorption layer is "sealed" in an enclosure bounded by the substrate, the pellicle frame, and the pellicle membrane. The enclosure is also referred to as a pellicle mask assembly. With the pellicle mask assembly, contaminants will mostly form on the outside surfaces of the pellicle membrane. Due to different depth of focus (DOF), impurities on the surface of the pellicle membrane do not transfer to the wafer 114. However, the patterned absorption layer is not completely immune from mask haze formation for at least two reasons. First, chemical residues, such as $NH_3$, are not completely removed from the surfaces of the mask within the enclosure. Second, small holes are commonly drilled into the pellicle frame so that the pressure of the air in the enclosure remains equal to the ambient air pressure. These holes provide paths for atmospheric gases entering into the enclosure.

Currently, one way of monitoring mask haze formation inside the pellicle mask assembly is to monitor the imaging quality of the wafers. When the number of defects on the imaged wafers exceeds a threshold, the mask 110 is removed from the production line and then cleaned. However, this method results in too much yield loss to be economical in some instances. The present disclosure provides a mechanism for early prevention of mask haze formation inside a pellicle mask assembly, as discussed below.

Figure 2:
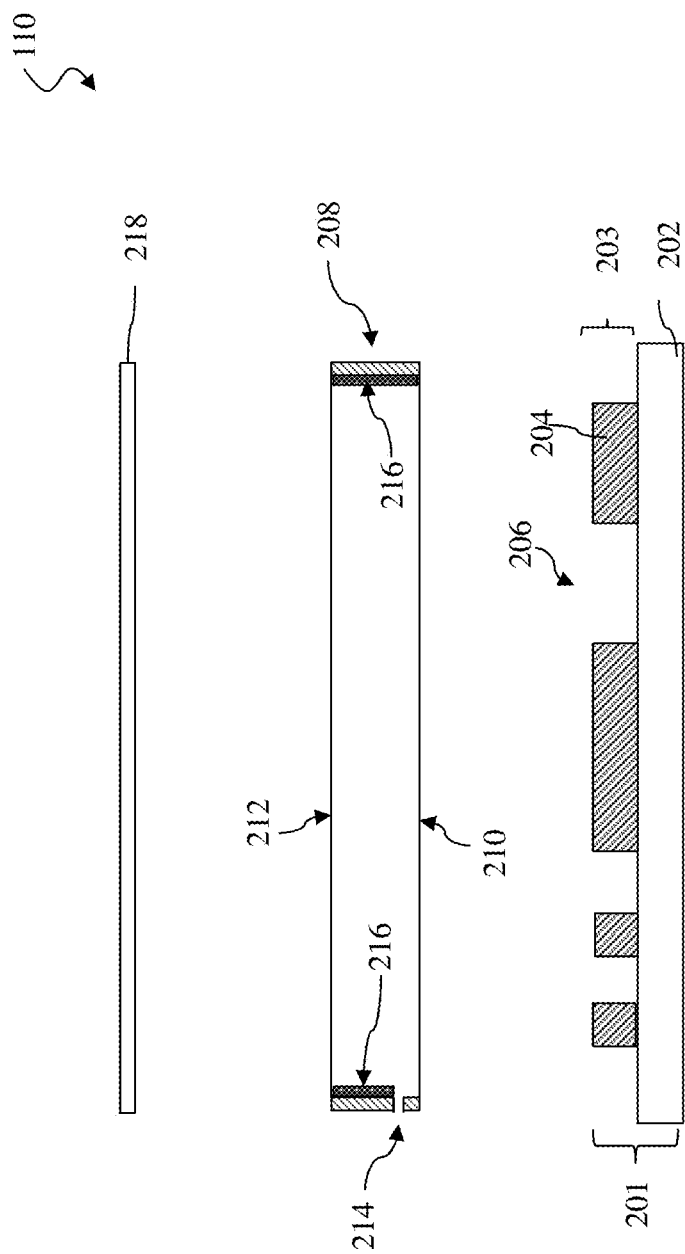
FIGS. 2 and 3 illustrate a mask assembly constructed according to aspects of the present disclosure in one or more embodiments.
Figure 3:
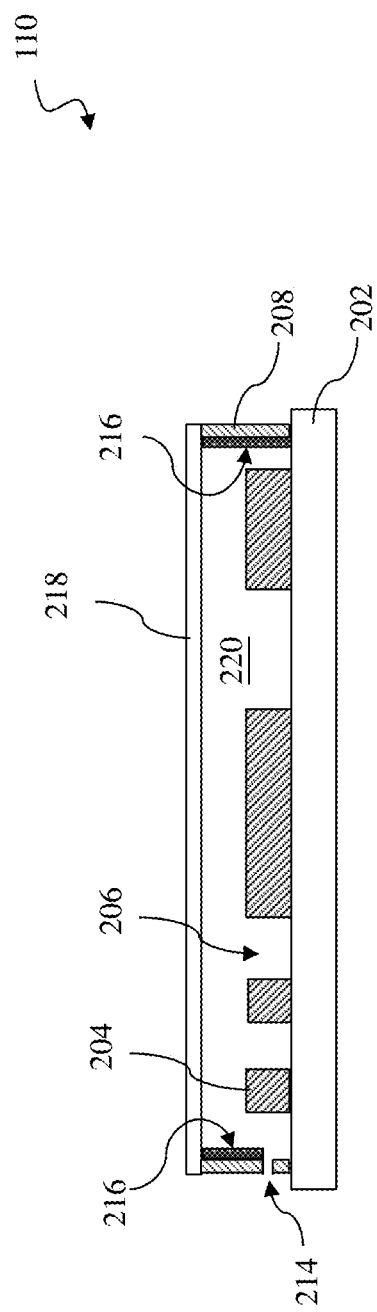

FIGS. 2 and 3 illustrate an embodiment of the pelliclized mask assembly 110 constructed according to various aspects of the present disclosure. Specifically, FIG. 2 shows various components of the mask assembly 110 before they are assembled and FIG. 3 shows the components assembled to form the mask assembly 110.

Referring to FIG. 2, the components used to form the mask assembly 110 include a mask 201, a pellicle frame 208, and a pellicle membrane 218. In the present embodiment embodiment, the mask 201 is a transmissive mask that includes a transparent substrate 202 and a patterned absorption layer 203. The transparent substrate 202 may use fused silica ($SiO_2$) relatively free of defects, such as borosilicate glass and soda-lime glass. The transparent substrate 202 may use calcium fluoride and/or other suitable materials, such as fused quartz, silicon carbide, and silicon oxide-titanium oxide alloy. The patterned absorption layer 203 may be formed using a plurality of processes and a plurality of materials, such as depositing a metal film made with chromium (Cr), MoSi, or MoSiON. The patterned absorption layer 203 includes opaque regions 204 and transparent regions 206. A light beam may be partially or completely blocked when directed on the opaque regions 204. Either the opaque regions 204 or the transparent regions 206 may represent IC design patterns, depending on the type of the resist (e.g. positive resist or negative resist) coated on the wafer 114 (FIG. 1) and the IC patterns (e.g. trenches or lines) to be formed on the wafer 114. The mask 201 may incorporate resolution enhancement techniques such as phase shift mask (PSM) and/or optical proximity correction (OPC). In another embodiment, the mask 201 is a reflective mask, such as one used in EUV lithography. In the following discussion, the mask 201 is a transmissive mask. However, those of ordinary skill in the art should appreciate that the present disclosure can be used with either a transmissive mask or a reflective mask.

Still referring to FIG. 2, the pellicle frame 208 has a bottom side 210 and a top side 212, wherein the bottom side 210 will be attached to the mask 201 and the top side 212 will be attached to the pellicle membrane 218. The pellicle frame 208 may be a round shape, a rectangular shape, or any other shape, and will be mounted in a region of the mask 201 surrounding the IC design patterns. The pellicle frame 208 is made of a rigid material, such as aluminum or plastic, with a thickness of about 6 mm to about 11 mm in one or more embodiments. The height of the pellicle frame 208 is designed such that the pellicle membrane 218 will be mounted at a distance from the mask 201 and impurities on the surfaces of the pellicle membrane 218 will be out of focus during lithography exposing processes. In the present embodiment, the pellicle frame 208 includes one or more vent holes 214. The vent hole 214 is used for maintaining a balance of air pressure between the inside of the mask assembly 110 and the outside environment (FIG. 3). In some embodiments, the pellicle frame 208 does not include the vent hole 214. Further, in the present embodiment, the pellicle frame 208 includes an indicator 216 on the inner surface of the pellicle frame 208. The indicator 216 is visible through the pellicle membrane 218 and is configured to monitor a change of environment inside the mask assembly 110, according to various aspects of the present disclosure.

In an embodiment, the indicator 216 is used for monitoring humidity inside the mask assembly 110. As discussed above, humidity is thought to be a root cause for the mask haze. When there is an increased humidity inside the mask assembly 110, the risk of haze formation over the mask 201 increases. The indicator 216 can give an early warning sign before any haze or a certain amount of haze is formed on the mask 201. To further this embodiment, the indicator 216 may be configured to display different colors in response to different levels of humidity inside the mask assembly 110. For example, the indicator 216 may include a humidity sensitive material, such as cobalt (II) chloride and copper (II) chloride. Such material displays a first color when the relative humidity (RH) is near 0% and changes its color as the RH increases. The color of the indicator 216 is then compared to a range of predefined colors. When it matches one of the predefined colors, a preventative action may be performed. For example, the mask 201 may be removed from the mask assembly 110 and sent for cleaning. This method reduces the loss of wafer yield compared to the traditional mask haze monitoring method.

In another embodiment, the indicator 216 is used for monitoring the level of chemical ion density inside the mask assembly 110. Chemical ions are also responsible for the mask haze formation. Therefore, it is advantageous to give a warning sign when the density of chemical ions inside the mask assembly 110 reaches a certain threshold. To further this embodiment, the indicator 216 may be configured to display different colors in response to different levels of chemical ion density inside the mask assembly 110. For example, the indicator 216 may include one of: phenolphthalein, bromothymol blue, methyl red, thymol blue, litmus, and transition metal ions. Such material displays different colors in response to the acidity or basicity of its surrounding environment. A preventative action can be performed to the mask 201 when the color of the indicator 216 matches a predefined color or falls within a range of predefined colors.

In yet another embodiment, the indicator 216 is used for monitoring the amount of outgassing inside the mask assembly 110 during the lithography exposure processes. For example, some gases may be dissolved, trapped, frozen, or absorbed in the mask 201. During the lithography exposure processes, the gases are released due to highly energized photons produced with shorter exposure wavelengths of the radiation energy 102 (FIG. 1). The gases may also be responsible for the mask haze formation. Therefore, it is advantageous to know the level of such outgassing inside the mask assembly 110 and gives a warning sign when the level crosses a certain threshold. In some embodiment, the same material may be used for monitoring both the ionization and the outgassing inside the mask assembly 110.

In an embodiment, the indicator 216 includes multiple sections. For example, it may include a first section and a second section, wherein the first section is configured to monitor increased humidity and the second section is configured to monitor increased chemical ion density. When either section gives a warning sign (such as the matching of a predefined color), the mask 201 may be removed from the mask assembly 110 and sent to a cleaning facility. In embodiments, the indicator 216 may include two or more sections with each section configured to detect one of the environmental changes discussed above.

In an embodiment, the pellicle frame 208 includes the indicator 216 on one or more sides of its inner surface. For example, in a rectangular shaped pellicle frame 208, the indicator 216 may be coated onto two, three, or four sides of the inner surface of the pellicle frame 208. When the indicator 216 on any one side gives a warning sign, a preventative action may be taken for the mask 201.

In various embodiments, the indicator 216 may be coated or deposited onto the inner surface of the pellicle frame 208. In one example, an indicator material is first mixed with a polymer glue and the mixture is then applied onto the inner surface of the pellicle frame 208. In another example, the indicator 216 is deposited onto the inner surface of the pellicle frame 208 using one of: chemical plating, chemical vapor deposition, sputtering, spray coating, or other suitable methods. In an embodiment, a porous polymer is subsequently applied onto the indicator 216 for protective and fixative purposes. In some examples, the pellicle frame 208 has a rough or irregular inner surface, and the indicator 216 may be coated onto the inner surface to achieve a smooth surface in addition to monitoring the internal environment of the mask assembly 110.

Still referring to FIG. 2, the pellicle membrane 218 is a thin transparent film stretched over the top side 212 of the pellicle frame 208. The pellicle membrane 218 may use one of the commercially available films, such as "Film 602" or "Film 703" sold by Micro Lithography, Inc. of Sunnyvale, Calif. The pellicle membrane 218 may be made of suitable materials such as "CYTOP" manufactured by Asahi Glass Co., Ltd. of Tokyo, Japan or "FLON AF" resin manufactured by DuPont Kabushiki Kaisha, of Tokyo, Japan. Other materials for the pellicle membrane 218 may include nitrocellulose, fluororesin, plastic resin, synthetic quartz glass, or the like. The pellicle membrane 218 may be from about 2 um thick to about 5 um thick, but these are only examples, and other thicknesses may be used. The pellicle membrane 218 is stretched to remove slack.

The mask assembly 110 may include other components, such as antireflective coating on the pellicle membrane 218, frame filter covering the vent hole 214 external to the pellicle frame 208, and other suitable components.

In an embodiment, the pellicle membrane 218 is adhered to the pellicle frame 208 with an adhesive, such as a 1 um film of fluorocarbon resin. In an embodiment, the pellicle frame 208 is attached to the mask 201 using a pressure sensitive adhesive.

FIG. 3 shows that the various components are assembled to form the mask assembly 110. Specifically the mask 201, the pellicle frame 208, and the pellicle membrane 218 form a pellicle enclosure 220. The IC design patterns 204/206 are enclosed within the pellicle enclosure 220. When the mask assembly 110 is irradiated with the radiation energy 102 during lithography exposing processes (FIG. 1), the indicator 216 monitors the environment of the pellicle enclosure 220 and gives a warning sign when mask haze is likely to form, as discussed above.

Figure 4:
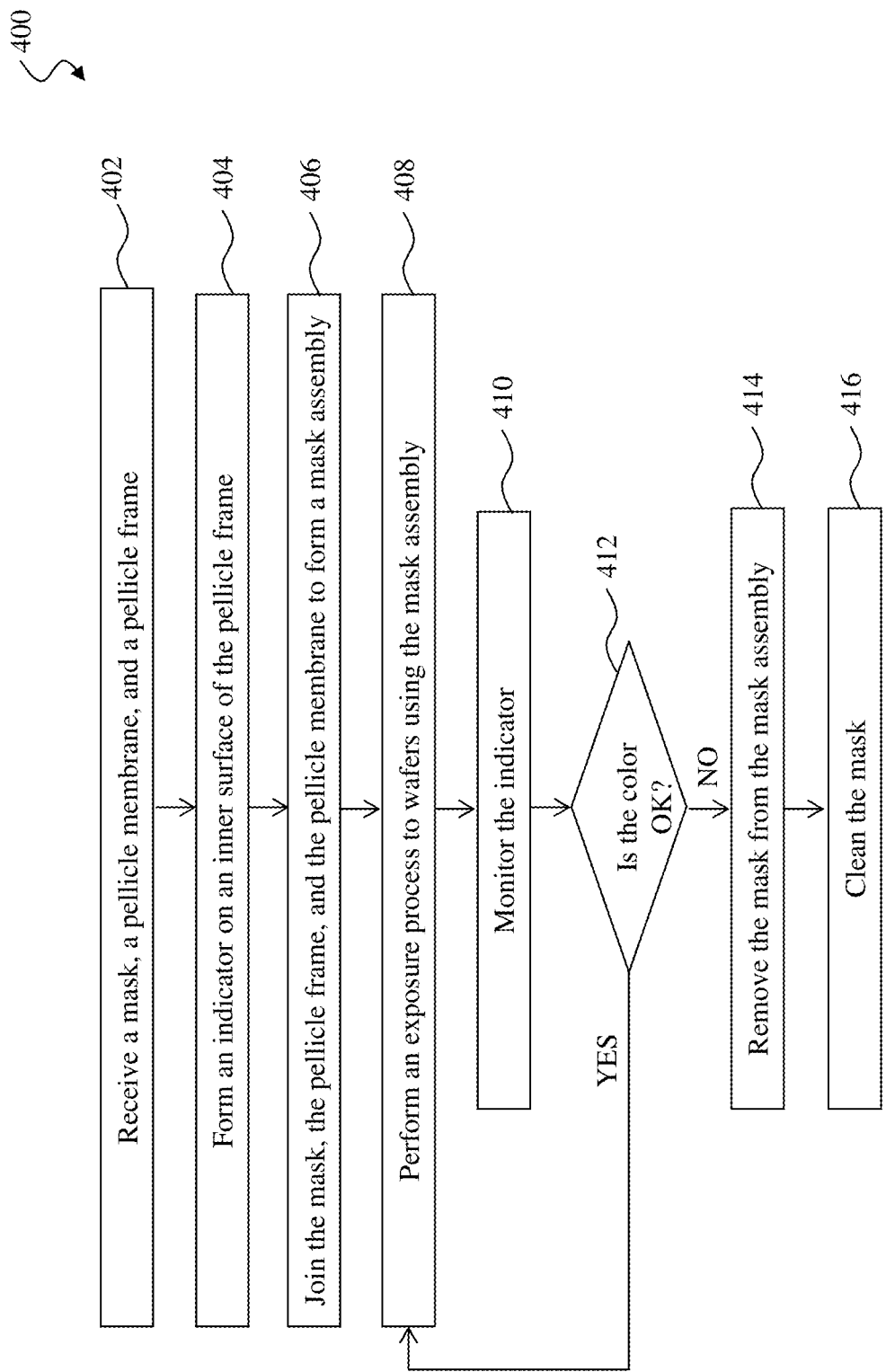
FIG. 4 is a flowchart of a method to be implemented in the lithography apparatus of FIG. 1 in accordance with one or more embodiments.

FIG. 4 shows a method 400 of forming the mask assembly 110 and then using it to expose wafers in a lithography system, such as the lithography system 100, according to various aspects of the present disclosure. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method.

Referring to FIG. 4, at operation 402, the method 400 receives the components for making a pellicle mask assembly including the mask 201, the pellicle frame 208, and the pellicle membrane 218. At operation 404, the method 400 forms the indicator 216 on an inner surface of the pellicle frame 208. In one example, operation 404 mixes an indicator material with a polymer glue and applies the mixture onto the inner surface of the pellicle frame 208. In another example, operation 404 deposits the indicator 216 onto the inner surface of the pellicle frame 208 using one of: chemical plating, chemical vapor deposition, sputtering, spray coating, or other suitable methods. In an embodiment, operation 404 subsequently applies a porous polymer onto the indicator 216 for protective and fixative purposes.

At operation 406, the method 400 joins the various components including the mask 201, the pellicle membrane 218, and the pellicle frame 208 to form the mask assembly 110, substantially as shown in FIG. 3. In an embodiment, the operation 406 first mounts the pellicle membrane 218 to the pellicle frame 208 with an adhesive such as a 1 um film of fluorocarbon resin, and then mounts the pellicle membrane/frame assembly to the mask 201 with a pressure sensitive adhesive.

At operation 408, the method 400 uses the mask assembly 110 to expose one or more wafers in a lithography system, such as the lithography system 100 (FIG. 1). During lithography exposing processes, the indicator 216 is configured to detect a change of environment inside the mask assembly 110, such as increased humidity, increased chemical ion density, increased outgassing, or a combination thereof. The indicator 216 is being monitored at operation 410. In an embodiment, the indicator 216 displays different colors in response to the changed environment. At operation 412, the color of the indicator 216 is checked and compared to a range of predefined colors. Some of the predefined colors indicate that mask haze is likely to form and the mask 201 is due for cleaning. These are "NOT OK" colors. Some of the predefined colors indicate that mask haze is unlikely to form and the mask 201 can be used for further exposure processes. These are "OK" colors. When the indicator 216 displays one of the "NOT OK" colors, the method 400 transitions to operation 414. Otherwise, it proceeds to operation 408 to expose more wafers with the mask assembly 110.

At operation 414, the method 400 removes the mask 201 from the mask assembly 110. The pellicle frame 208 and the pellicle membrane 218 may be disposed appropriately. At operation 416, the method 400 cleans the mask 201 to remove any mask haze or particulate contaminations. Due to the preventative function of the indicator 216, it is likely that the mask 201 has very little or no mask haze formed thereon. Therefore, it is easy to clean the mask 201. Thereafter, the mask 201 is reassembled with another set of pellicle membrane and pellicle frame, and the above operations are repeated.

Although not intended to be limiting, one or more embodiments of the present disclosure provide many benefits to mask haze prevention. For example, it is desirable to have as many wafer exposures as possible before a mask must undergo some cleaning processes. At the same time, it is desirable to keep the wafer yield high and not sacrifice wafers for monitoring mask haze. The pellicle frame indicator of the present disclosure helps achieve both goals by providing an early warning sign with respect to the internal environment of the pellicle mask assembly. Also, adding the indicator to the pellicle frame can be easily integrated into existing pellicle mounting processes.

In one exemplary aspect, the present disclosure is directed to an apparatus in semiconductor manufacturing. The apparatus includes a mask, a pellicle frame, and a pellicle membrane. The pellicle frame has a bottom side and a top side. The bottom side is attached to the mask and the top side is covered by the pellicle membrane, thereby forming a mask assembly. The pellicle frame includes a coating on its inner surface. The coating is configured to monitor a change of environment inside the mask assembly.

In another exemplary aspect, the present disclosure is directed to a method. The method includes receiving a mask with an integrated circuit (IC) design layout, receiving a pellicle frame having a top side and a bottom side, forming an indicator on an inner surface of the pellicle frame, attaching a pellicle membrane on the top side of the pellicle frame, and attaching the mask to the bottom side of the pellicle frame. The pellicle membrane, the pellicle frame, and the mask form a mask assembly. The indicator is configured to detect different levels of humidity or chemical ion density inside the mask assembly. In embodiments, the method further includes exposing wafers with the mask assembly, and monitoring a color displayed by the indicator. When the color becomes one of predefined colors, the method further includes removing the mask from the mask assembly and cleaning the mask.

In yet another exemplary aspect, the present disclosure is directed to a method. The method includes receiving a mask, a pellicle frame, and a pellicle membrane. The method further includes coating an inner surface of the pellicle frame with a first material to form an indicator. The method further includes joining the mask, the pellicle frame, and the pellicle membrane thereby forming a mask assembly, wherein the indicator is operable to detect different levels of humidity inside the mask assembly by displaying different colors in response thereto.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus in semiconductor manufacturing, comprising:
   a mask;
   a pellicle frame having a bottom side and a top side, wherein the bottom side is attached to the mask; and
   a pellicle membrane covering the top side of the pellicle frame,
   wherein the mask, the pellicle frame, and the pellicle membrane form a mask assembly, and wherein the pellicle frame includes a coating on its inner surface and the coating is configured to monitor a change of environment inside the mask assembly.

2. The apparatus of claim 1, wherein the change of environment is increased humidity.

3. The apparatus of claim 2, wherein the coating is configured to display different colors in response to different levels of humidity inside the mask assembly.

4. The apparatus of claim 2, wherein the coating includes one of: cobalt (II) chloride and copper (II) chloride.

5. The apparatus of claim 1, wherein the change of environment is increased chemical ion density.

6. The apparatus of claim 5, wherein the coating is configured to display different colors in response to different levels of chemical ion density inside the mask assembly.

7. The apparatus of claim 5, wherein the coating includes one of: phenolphthalein, bromothymol blue, methyl red, thymol blue, litmus, and transition metal ions.

8. The apparatus of claim 1, wherein the coating includes first and second sections, the first section is configured to monitor increased humidity, and the second section is configured to monitor increased chemical ion density.

9. The apparatus of claim 1, wherein the pellicle frame includes the coating on multiple sides of its inner surface.

10. A method, comprising the steps of:
    receiving a mask with an integrated circuit (IC) design layout;
    receiving a pellicle frame having a top side and a bottom side;
    forming an indicator on an inner surface of the pellicle frame;
    attaching a pellicle membrane on the top side of the pellicle frame; and
    attaching the mask to the bottom side of the pellicle frame, wherein the pellicle membrane, the pellicle frame, and the mask form a mask assembly, and wherein the indicator is configured to detect different levels of humidity or chemical ion density inside the mask assembly.

11. The method of claim 10, wherein the indicator includes one of: cobalt (II) chloride and copper (II) chloride.

12. The method of claim 10, wherein the indicator includes one of: phenolphthalein, bromothymol blue, methyl red, thymol blue, litmus, and transition metal ions.

13. The method of claim 10, wherein the indicator includes first and second sections, the first section is configured to detect humidity, and the second section is configured to detect chemical ion density.

14. The method of claim 10, wherein the forming of the indicator includes:
    mixing an indicator material with a polymer glue; and
    applying the mixture onto the inner surface of the pellicle frame.

15. The method of claim 10, wherein the forming of the indicator includes depositing the indicator over the inner surface of the pellicle frame using one of: chemical plating, chemical vapor deposition, sputtering, and spray coating.

16. The method of claim 15, further comprising:
applying a layer of porous polymer over the indicator.

17. The method of claim 10, further comprising the steps of:
exposing wafers with the mask assembly;
monitoring a color displayed by the indicator; and
when the color becomes one of predefined colors, performing the steps of:
removing the mask from the mask assembly; and
cleaning the mask.

18. A method, comprising:
receiving a mask, a pellicle frame, and a pellicle membrane;
coating an inner surface of the pellicle frame with a first material to form an indicator; and
joining the mask, the pellicle frame, and the pellicle membrane thereby forming a mask assembly, wherein the indicator is operable to detect different levels of humidity inside the mask assembly by displaying different colors in response thereto.

19. The method of claim 18, wherein the first material is one of: cobalt (II) chloride and copper (II) chloride.

20. The method of claim 18, further comprising the steps of:
exposing wafers with the mask assembly;
monitoring a color displayed by the indicator; and
when the color becomes one of predefined colors, performing the steps of:
removing the mask from the mask assembly; and
cleaning the mask.

* * * * *